United States Patent
Yang

[19]

[11] Patent Number: 6,018,168
[45] Date of Patent: Jan. 25, 2000

[54] SEMICONDUCTOR MEMORY DEVICES HAVING ALTERNATING WORD LINE REVERSE DIODES AND WELL BIAS TAPPING REGIONS

[75] Inventor: Hyang-Ja Yang, Kyungki-do, Rep. of Korea

[73] Assignee: Samsung Electronics Co., Ltd., Rep. of Korea

[21] Appl. No.: 09/119,249

[22] Filed: Jul. 20, 1998

Related U.S. Application Data

[63] Continuation-in-part of application No. 08/671,498, Jun. 27, 1996, abandoned.

[30] Foreign Application Priority Data

Jun. 30, 1995 [KR] Rep. of Korea ....................... 95-18961

[51] Int. Cl.[7] ............................. H01L 27/11; H01L 23/60
[52] U.S. Cl. ......................... 257/207; 257/356; 257/904
[58] Field of Search .................................. 257/207, 356, 257/904

[56] References Cited

U.S. PATENT DOCUMENTS

| | | | |
|---|---|---|---|
| 4,408,385 | 10/1983 | Mohan Rao et al. | 257/904 |
| 5,293,559 | 3/1994 | Kim et al. | 365/63 |
| 5,373,476 | 12/1994 | Jeon | 365/226 |
| 5,446,689 | 8/1995 | Yasui et al. | 365/154 |
| 5,936,282 | 8/1999 | Baba et al. | 257/356 |

OTHER PUBLICATIONS

Shone et al., "Gate Oxide Charging and Its Elimination for Metal Antenna Capacitor and Transistor in VLSI CMOS Double Layer Metal Technology", 1989 Symposium on VLSI Technology Digest of Technical Papers, May 22–25, 1989, Kyoto, Japan, pp. 73–74.

Tsunokuni et al., "The Effect of Charge Build–up on Gate Oxide Breakdown During Dry Etching", Extended Abstracts of the 19th Conference on Solid State Devices and Materials, Tokyo–1987, pp. 195–198.

*Primary Examiner*—Gene M. Munson
*Attorney, Agent, or Firm*—Myers Bigel Sibley & Sajovec

[57] ABSTRACT

Semiconductor memory devices include a plurality of word line reverse diodes located at alternating ends of a plurality of parallel word lines. A plurality of well bias tapping regions are also located at alternating ends of the plurality of parallel word lines, but at opposite ends of the word lines from the plurality of reverse diodes. A compact semiconductor memory device is thereby provided.

8 Claims, 8 Drawing Sheets

SEMICONDUCTOR MEMORY DEVICES HAVING ALTERNATING WORD LINE REVERSE DIODES AND WELL BIAS TAPPING REGIONS

CROSS-REFERENCE TO RELATED APPLICATIONS

This continuation-in-part application is related to application Ser. No. 08/671,498, filed Jun. 27, 1996, now abandoned, entitled "*Semiconductor Memory Devices Having Alternating Word Line Reverse Diodes and Well Bias Tapping Regions*", to the present inventor Hyang-Ja Yang, assigned to the assignee of the present application, the disclosure of which is hereby incorporated herein by reference.

FIELD OF THE INVENTION

The present invention relates to word line arrangements for memory cell arrays, and more particularly to word line arrangements for memory cell arrays comprising a ground voltage strapping line, a word line strapping line and a word line reverse diode.

BACKGROUND OF THE INVENTION

In conventional high-density semiconductor memory devices, a double metal process is generally used to improve the characteristics of the semiconductor memory elements. In a double metal process, before a second metal is formed, a reverse diode is formed at a gate of the transistors. In anticipation of damage incurred from a radio frequency (RF) etchback process, the gate is connected to a first metal through a via contact, to thereby dissipate charge into the substrate without building-up the charge on the gate. Accordingly, build-up of charge generated from the gate of the transistor during the etchback process is prevented.

Such methods may also be applied to a word line of a memory cell array which receives a gate signal through the second metal from a row decoder. The word line is connected to the first metal through a via contact, thereby causing shifting and degradation of the threshold voltage of the transistor due to the charge-up phenomenon in the RF etchback process. In order to prevent shifting and degradation of the threshold voltage, a reverse diode, also referred to as a "word line reverse diode", is formed at the word line.

Word line reverse diodes are described in publications entitled "*Gate Oxide Charging and Its Elimination For Metal Antenna Capacitor and Transistor in VLSI CMOS Double Layer Metal Technology*" by Shone et al., 1989 Symposium on VLSI Technology Digest of Technical Papers, May 22–25, 1989, Kyoto, Japan, pp. 73–74, and "*The Effect of Charge Build-Up on Gate Oxide Breakdown During Dry Etching*" by Tsunokuni et al., Extended Abstracts of the 19th Conference on Solid State Devices and Materials, Tokyo, 1987, pp. 195–198, the disclosures of which are hereby incorporated herein in their entirety by reference.

In semiconductor memory devices, the chip area is primarily occupied by the memory cell array. The area of the semiconductor occupied by the memory cell array may be increased by installing a ground voltage strapping line, a word line strapping line and the word line reverse diodes in the cell array of the semiconductor memory device. Also, unlike ground voltage strapping every eight cells, in the case of sixteen cell strapping, it is important to perform a well bias tapping at a portion of a well edge of a cell. Ground strapping lines are described in U.S. Pat. No. 5,293,559 to Kim et al., that is assigned to the assignee of the present application, the disclosure of which is hereby incorporated herein in its entirety by reference. Well bias tapping regions are described in U.S. Pat. No. 5,373,476 to Jeon, that is assigned to the assignee of the present application, the disclosure of which is hereby incorporated herein in its entirety by reference.

However, there have been problems because well bias tapping cannot be readily performed by installation of a diode, or in which the diode is omitted and in which a reverse diode is installed. These structures may increase the size of the semiconductor memory chip.

SUMMARY OF THE INVENTION

It is therefore an object of the present invention to provide an arrangement of a ground voltage strapping line, a word line strapping line and a word line reverse diode which does not unduly increase the size of a semiconductor memory chip.

This and other objects are provided, according to the present invention, by semiconductor memory devices having alternating word line reverse diodes and well bias tapping regions. In particular, semiconductor memory devices according to the invention include a plurality of parallel word lines. A plurality of word line reverse diodes are located at alternating ends of the plurality of parallel word lines. A plurality of well bias tapping regions are also located at alternating ends of the plurality of parallel word lines, but at opposite ends of the word lines from the plurality of reverse diodes. Semiconductor memory devices according to the invention may also include first and second ground voltage strapping lines, a respective one of which extends along respective opposite ends of the word lines. The plurality of word line reverse diodes and the plurality of well bias tapping regions are located in the first and second ground voltage strapping lines.

In an embodiment of semiconductor memory devices according to the present invention, first and second parallel word lines each have a first and a second end. A first word line reverse diode is connected to the first word line at the first end. A second word line reverse diode is connected to the second word line at the second end. A first ground voltage strapping line extends along the first end of the first and second word lines. A second ground voltage strapping line extends along the second ends of the first and second word lines. A first well bias tapping region is located in the second ground voltage strapping line, at the second end of the first word line. A second well bias tapping region is located in the first ground voltage strapping line, at the first end of the second word line. The first word line reverse diode may also be located in the first ground voltage strapping line, and the second word line reverse diode may also be located in the second ground voltage strapping line. Compact memory array arrangements are thereby provided.

DETAILED DESCRIPTION OF PREFERRED EMBODIMENTS

Figure 1:
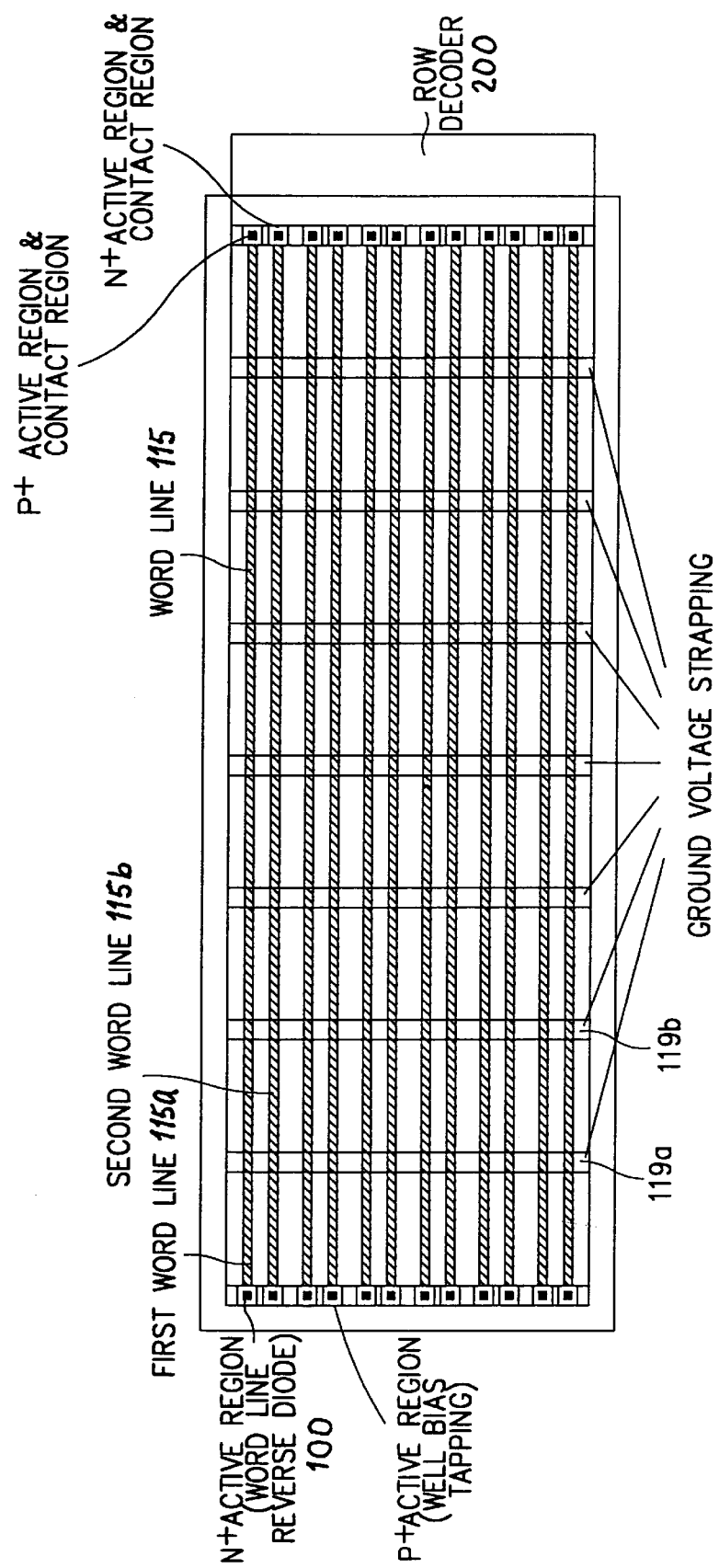
FIG. 1 is a planar view of a memory cell array according to the invention, including a word line reverse diode and a well bias tapping.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Semiconductor memory devices according to the invention may include a ground voltage strapping line, a word line strapping line and a word line reverse diode. A word line reverse diode is arranged at the left side of a first word line to thereby prevent charge accumulation at a gate portion of a transistor during a radio frequency etchback process. A word line reverse diode is also arranged at the right side of a second word line. A well bias tapping is arranged in a ground voltage strapping line positioned at the right side of the first word line by utilizing a P-type active region. A well bias tapping is also arranged in the ground voltage strapping line positioned at the left side of the second word line.

As is well known to those having skill in the art, the word line reverse diode may be used to prevent radio frequency damage from being caused during a radio frequency etchback process in a double metal layer structure. The radio frequency damage may be caused by argon that is charged in the first metal layer during the radio frequency etchback process, which may degrade the characteristics of the memory device. In order to prevent the charge-up of the transistors, a diode is connected between the gate and source of the transistor, to prevent charge accumulation.

As is also well known, ground voltage strapping lines may also be used in order to improve the speed of the memory device. In particular, as the integration density of the memory device increases and the number of memory cells in a row increases, the load on the row decoders may increase, thereby reducing the driving speed of the word lines in the memory device. Ground voltage strapping lines may be used to enhance the driving speed of the word lines, to allow highly integrated memory devices.

FIG. 1 is a planar view illustrating a cell array of a memory device including word line reverse diodes and well bias tappings. In particular, FIG. 1 illustrates a cell array in which first and second word lines are formed as one pair, to thereby alternately dispose the reverse diode and the well bias tapping. Accordingly, if the reverse diode of the first word line is disposed at the left side, the reverse diode of the second word line is disposed at the right side. A well bias tapping is disposed in a ground voltage strapping line positioned at the right side of the first word line by utilizing a $P^+$-type active region, and a well bias tapping is disposed in the ground voltage strapping line positioned at the left side of the second word line. The word line and an N-type active region are contacted by the word line reverse diode, and the word line and a P-type active region are contacted by the well bias tapping, utilizing a metal contact.

Figure 2A:
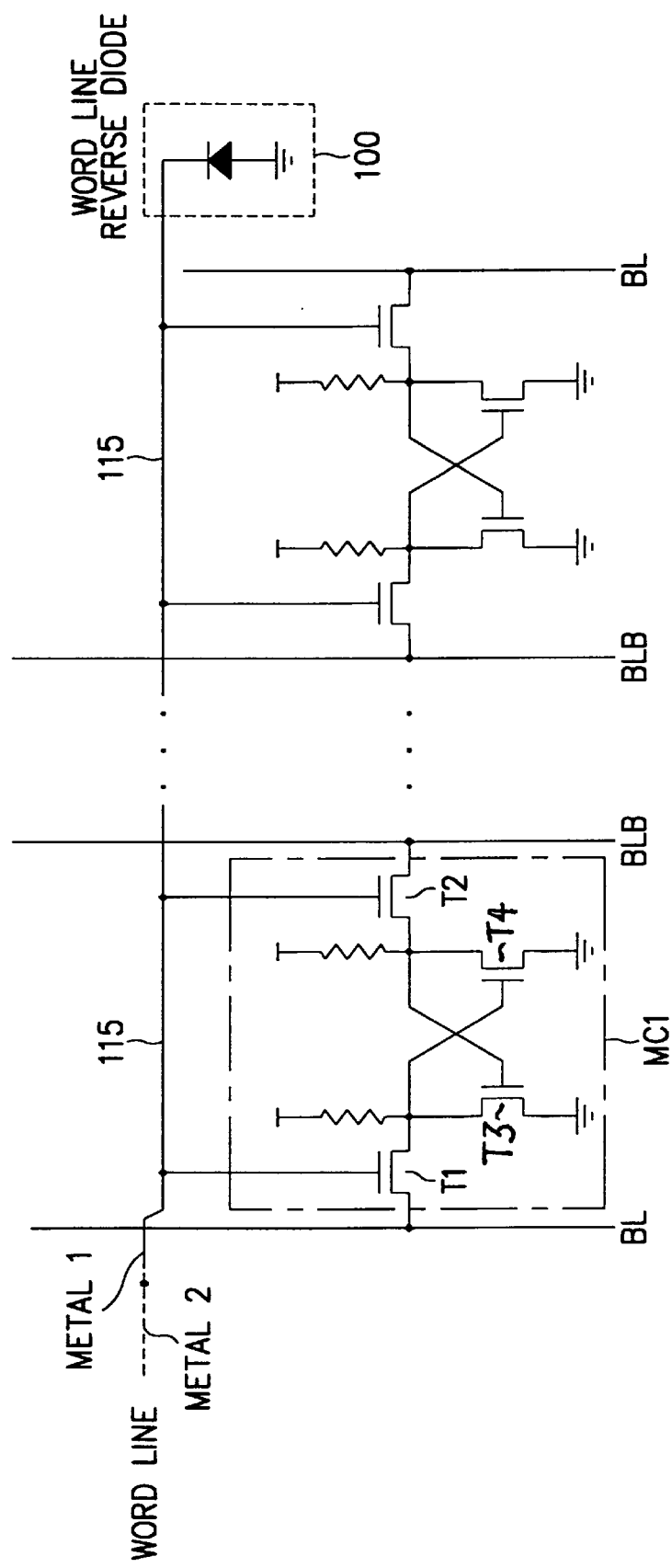
FIG. 2A is a circuit diagram of a memory cell array according to the invention, including a word line reverse diode.

FIG. 2A is a circuit diagram of a portion of a memory cell array that extends along one word line 115, and that includes a word line reverse diode 100. In particular, a plurality of memory cells are connected to the word line 115. Each memory cell, for example memory cell MC1, includes a pair of cross-coupled transistors T3 and T4 and a pair of pass transistors or access transistors T1 and T2. As is well known to those having skill in the art, the gates of the pass transistors T1 and T2 may be formed from the same layer as the word line 115. This layer is generally a patterned layer of doped polysilicon. A pair of bit lines BL and BLB are also connected to a respective pass transistor T1 and T2. The design of the memory cell MC1 is well known to those having skill in the art and need not be described further herein.

Figure 2B:
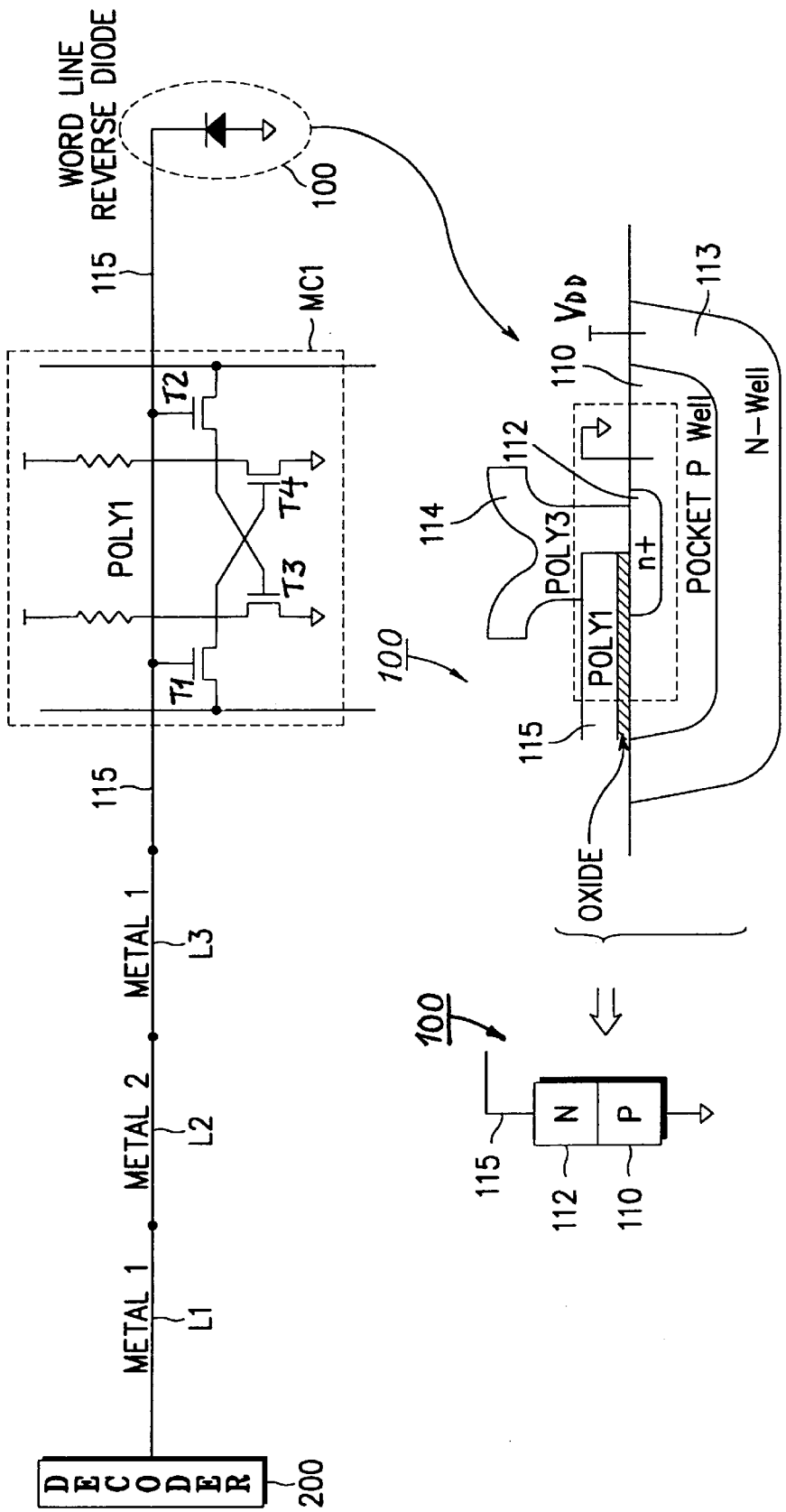
FIG. 2B is a detailed circuit diagram of a memory cell array according to the invention, illustrating details of a word line and a word line reverse diode.

FIG. 2B provides additional detail concerning the connection between word line 115 and row decoder 200, and also provides additional details on the construction of word line reverse diode 100. More specifically, as shown in FIG. 2B, the memory cell MC1 includes the pair of cross-coupled transistors T3 and T4, and the pair of pass transistors T1 and T2. Word line 115 is also labeled "POLY1" because it may be fabricated from a first patterned layer of doped polysilicon. As shown in FIG. 2B, the polysilicon word line 115 is connected to the n+ cathode region 112 of the word line reverse diode 100, using a doped polysilicon contact 114 that is labeled "POLY3" because it may be fabricated from a third patterned layer of polysilicon. The polysilicon contact 114 may be used, because the word line 115 is insulated from the n+ cathode region 112 by an oxide layer, as shown in FIG. 2B. Accordingly, polysilicon contact 114 contacts the polysilicon word line 115 to the n+ cathode region 112 of word line reverse diode 100. The polysilicon contact 114 may also be referred to as a "nested" contact, due to its nested cross-sectional shape as shown in FIG. 2B.

Continuing with the description of FIG. 2B, the anode region of word line reverse diode 100 is formed by a pocket P-well 110, that is connected to ground as shown. The pocket P-well 110 is included in an N-well 113 as shown.

As also shown in FIG. 2B, the polysilicon word line is not directly connected to the row decoder 200. Rather, three intervening metal lines L1, L2 and L3, also labeled as "METAL 1", "METAL 2" and "METAL 1" respectively, are used to connect the polysilicon word line 15 to the row decoder 200. The METAL 1 and METAL 2 connection is also illustrated in FIG. 2A. As shown in FIG. 2B, the output of the decoder 200 is connected to the first metal line L1 in a first metal layer in the integrated circuit, and the polysilicon word line 115 is also connected to the third metal line L3 in the first metal layer. The first and third lines L1 and L3 in the first metal layer METAL 1 are then electrically connected together using a second line L2 in a second metal layer METAL 2 that is on and insulated from the first metal layer METAL 1, using interlayer contacts. The first and second metal layers METAL 1 and METAL 2 are also collectively referred to as a "metal word line".

Figure 2C:
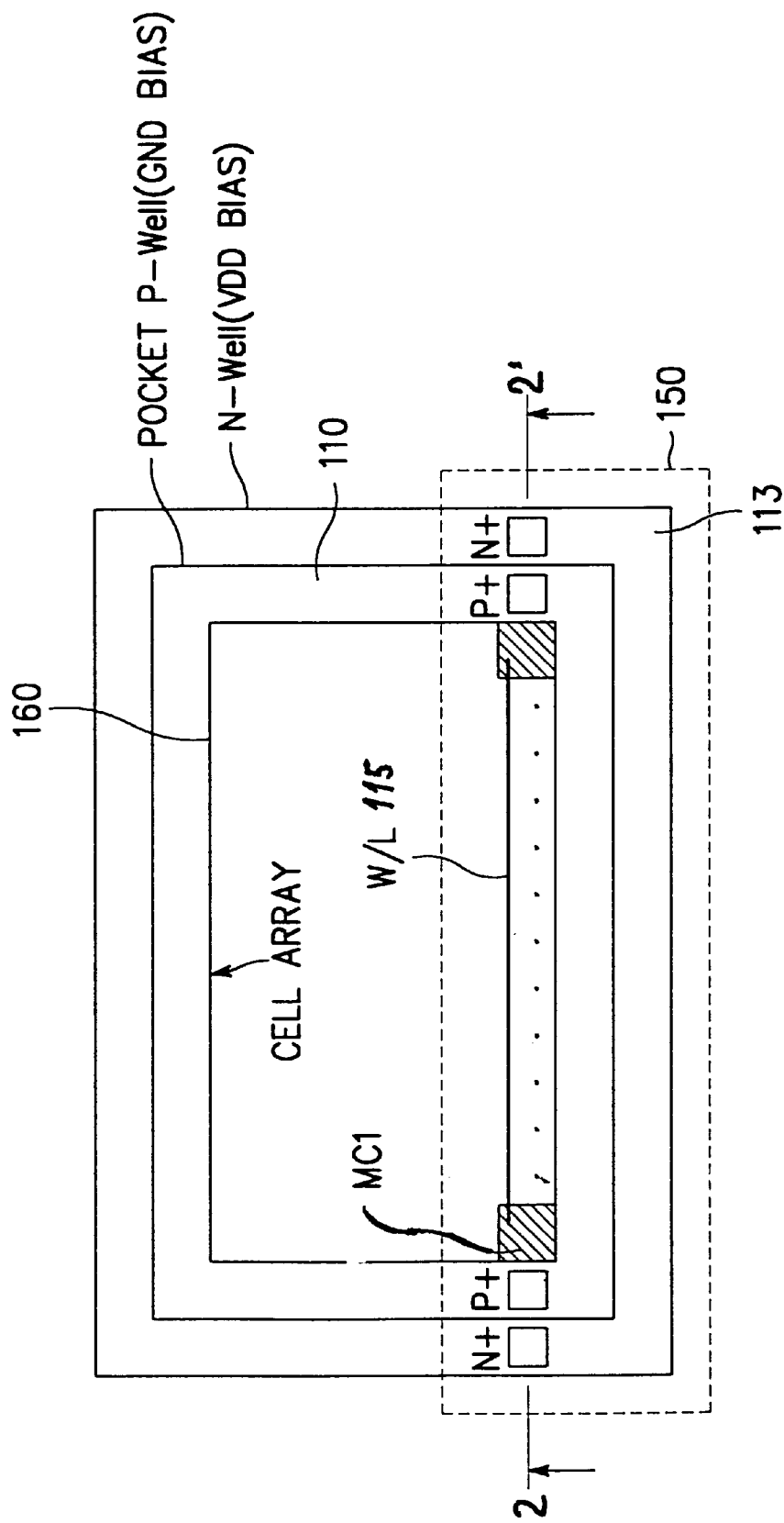
FIG. 2C is a plan view of a memory device including a pocket P-well and an N-well according to the invention.

FIG. 2C is a plan view of a semiconductor memory device illustrating the use of a pocket P-well to provide ground bias and an N-well to provide power supply voltage (VDD) bias. More specifically, as shown in FIG. 2C, a plurality of memory cells MC1, are arranged along a word line W/L 115 in a memory cell array 160. Up to 256, 512 or more memory cells may be connected to a single word line. The pocket P-well 110 may be used to provide ground bias for the memory cells. The N-well 115 may be used to provide power supply (VDD) bias for the memory cells. As was already described, the pocket P-well also may be used connect the anode of the word line reverse diode 110 to ground.

Figure 2D:
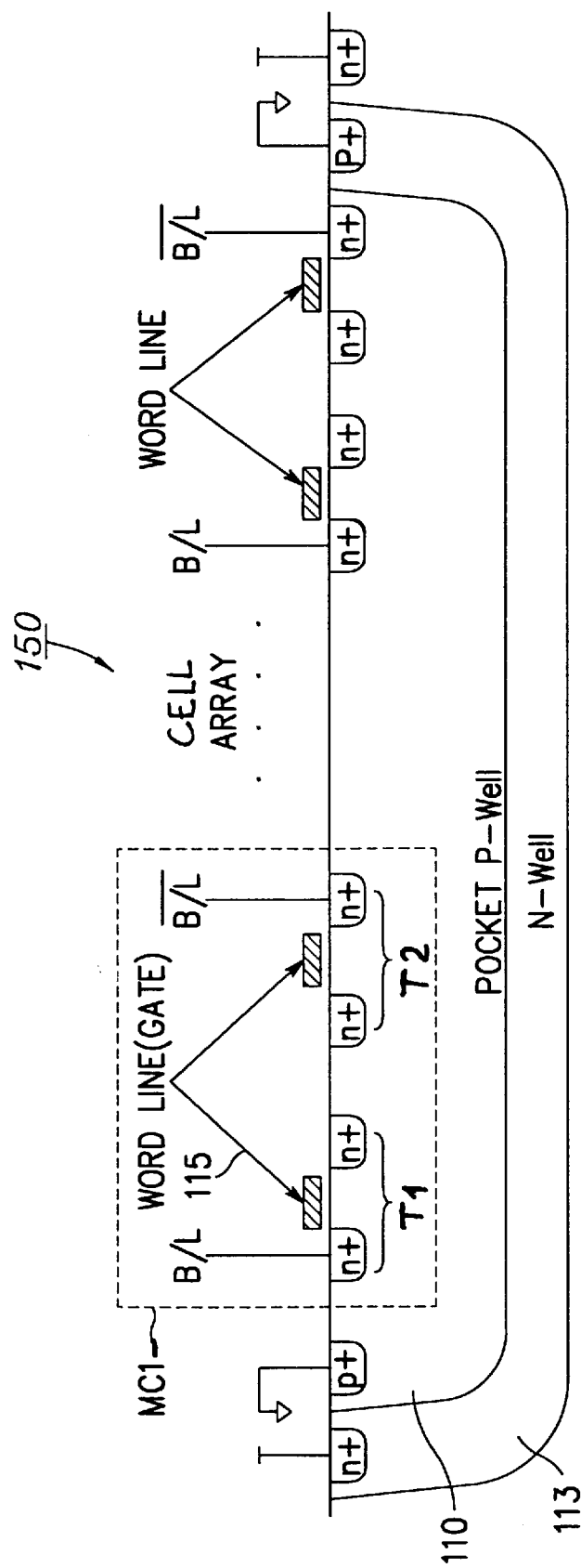
FIG. 2D is a cross-sectional view of FIG. 2C taken along the line 2–2'.

FIG. 2D is a cross-sectional view of FIG. 2C taken along the line 2–2'. The pocket P-well 110 is shown connected to ground and the N-well 113 is shown connected to the power supply voltage VDD. In the memory cell array, the pass transistors T1 and T2 are shown in the pocket P-well. The polysilicon word line 115 functions as the gate for the pass transistors T1 and T2. The bit line connections B/L and $\overline{B/L}$ are also shown.

Figure 2E:
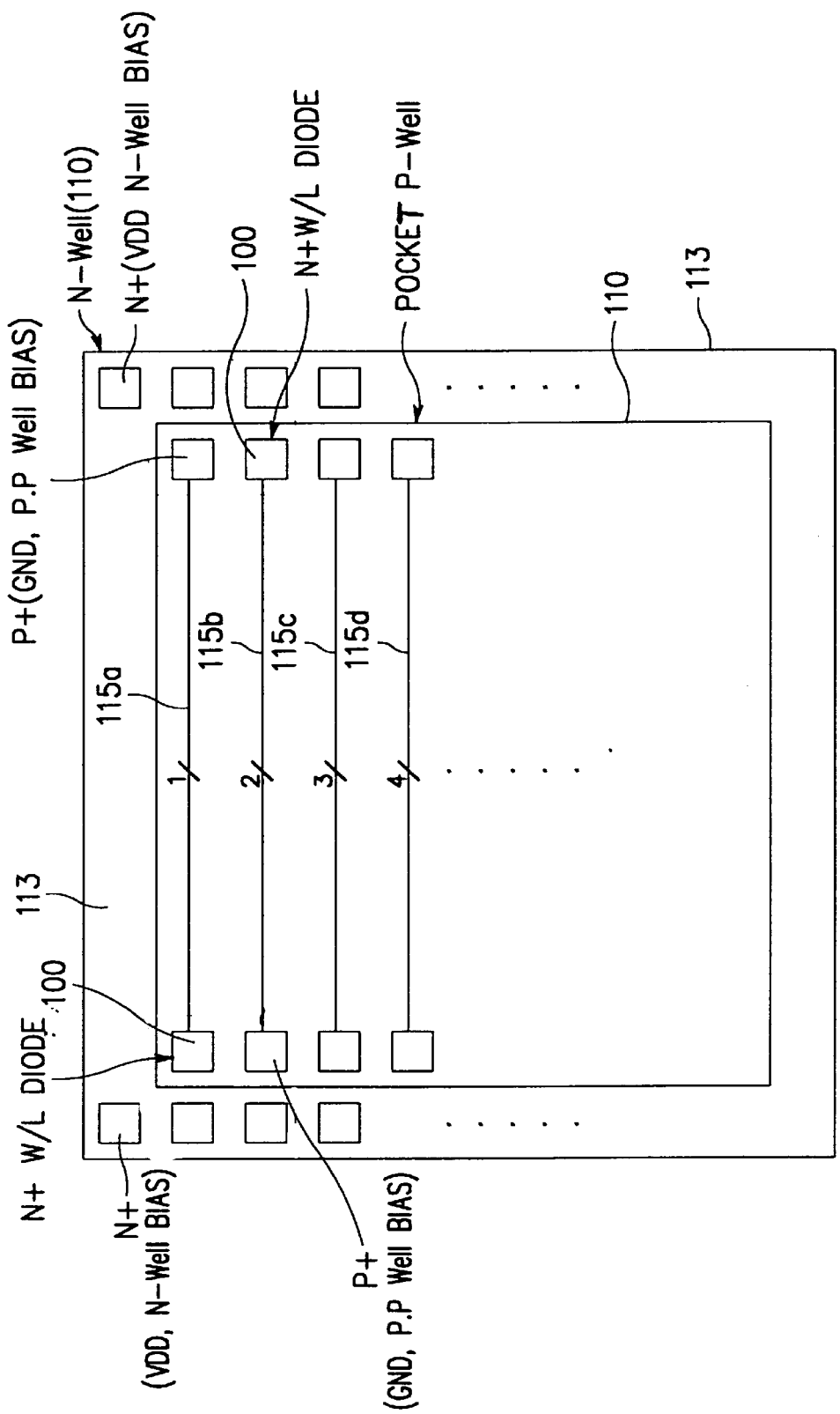
FIG. 2E is a plan view illustrating an alternating arrangement of word line reverse diodes and ground voltage strapping lines according to the present invention.
Figure 2F:
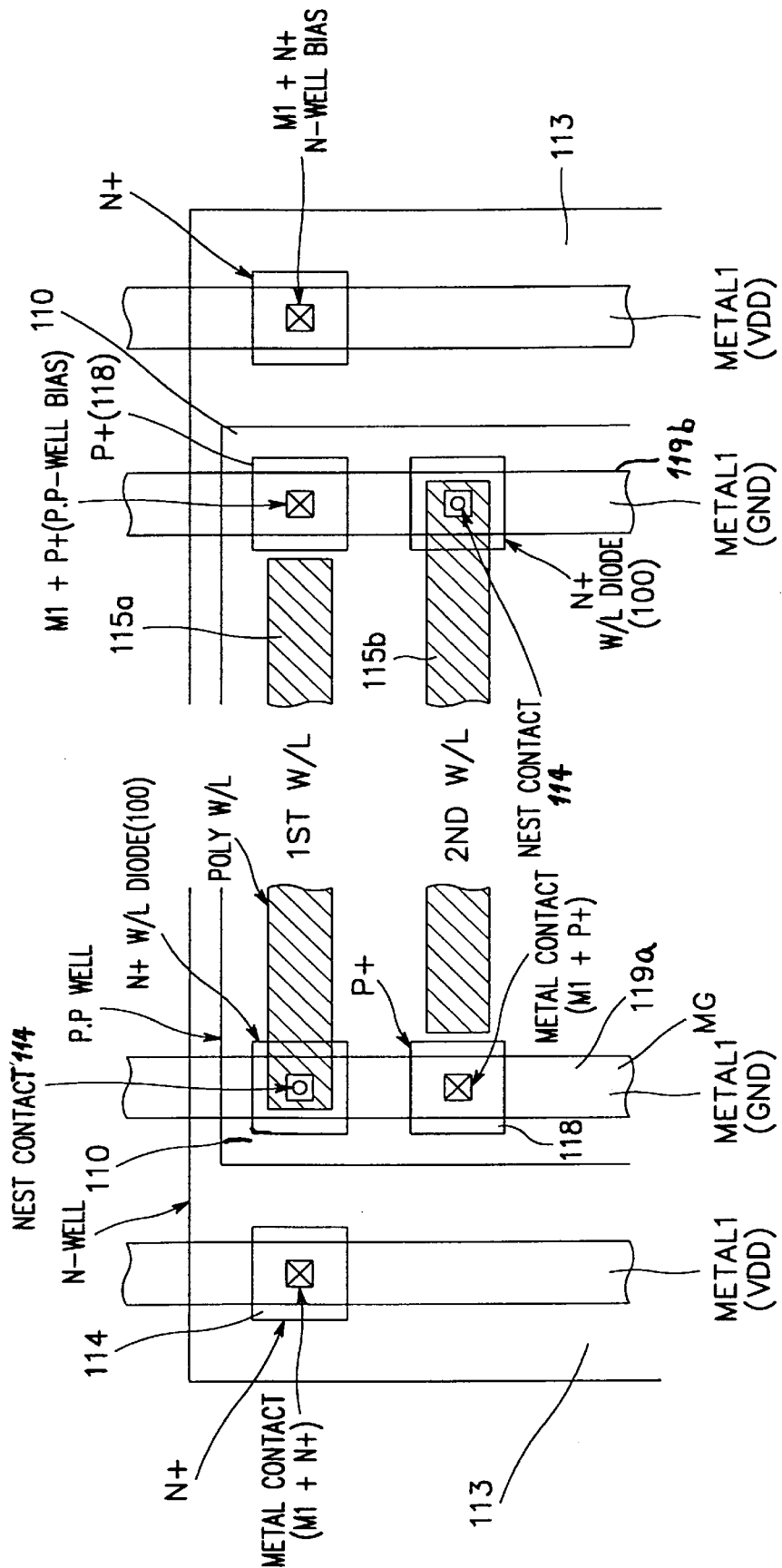
FIG. 2F is a detailed plan view illustrating an alternating arrangement of word line reverse diodes and ground voltage strapping lines according to the present invention.

FIGS. 2E and 2F are plan views illustrating the alternating arrangement of word line reverse diodes and ground voltage strapping lines at alternating ends of word lines. Four word lines are shown in FIG. 2E, labeled 115a–115d. A word line reverse diode 100 is shown at the left end of first word line 115a and at the right end of second word line 115b. A well bias tapping region is shown at the right end of the first word line 115a and at the left end of the second word line 115b.

FIG. 2F is an enlarged view illustrating two word lines 115a and 115b of FIG. 2E. As shown, the word line reverse diodes 100 are arranged at alternating ends of alternating word lines, and the well bias regions are located at the other alternating ends of the word lines. Thus, as shown in FIG. 2F, each word line reverse diode 100 includes the polysilicon word line, the polysilicon nest contact 114, the N+ cathode region 112 and the pocket P-well 110 which is connected to ground. The well bias tapping region is included in P-type active regions 118 that are arranged at alternate ends of alternating word lines, opposite the word line reverse diodes 100. The word line strapping region is arranged in the metal contact between the first metal layer and the second metal layer. The ground strapping lines 119a and 119b are arranged parallel to each other and orthogonal to the polysilicon word lines 115a and 115b.

In conclusion, in an integrated circuit memory device, an N-well region 114 and a P-well region 118 are used in order to bias the N-well 113 and the pocket P-well 110 respectively, at the power supply voltage VDD and the ground voltage GND respectively. Moreover, a word line reverse diode to prevent charge accumulation is connected to each polysilicon word line 115. As shown in FIG. 2F, the word line reverse diodes 100 and well bias tapping regions 118 are arranged at alternating ends of alternating word lines, to thereby allow a reduction in the size of the semiconductor memory chip.

Figure 3:
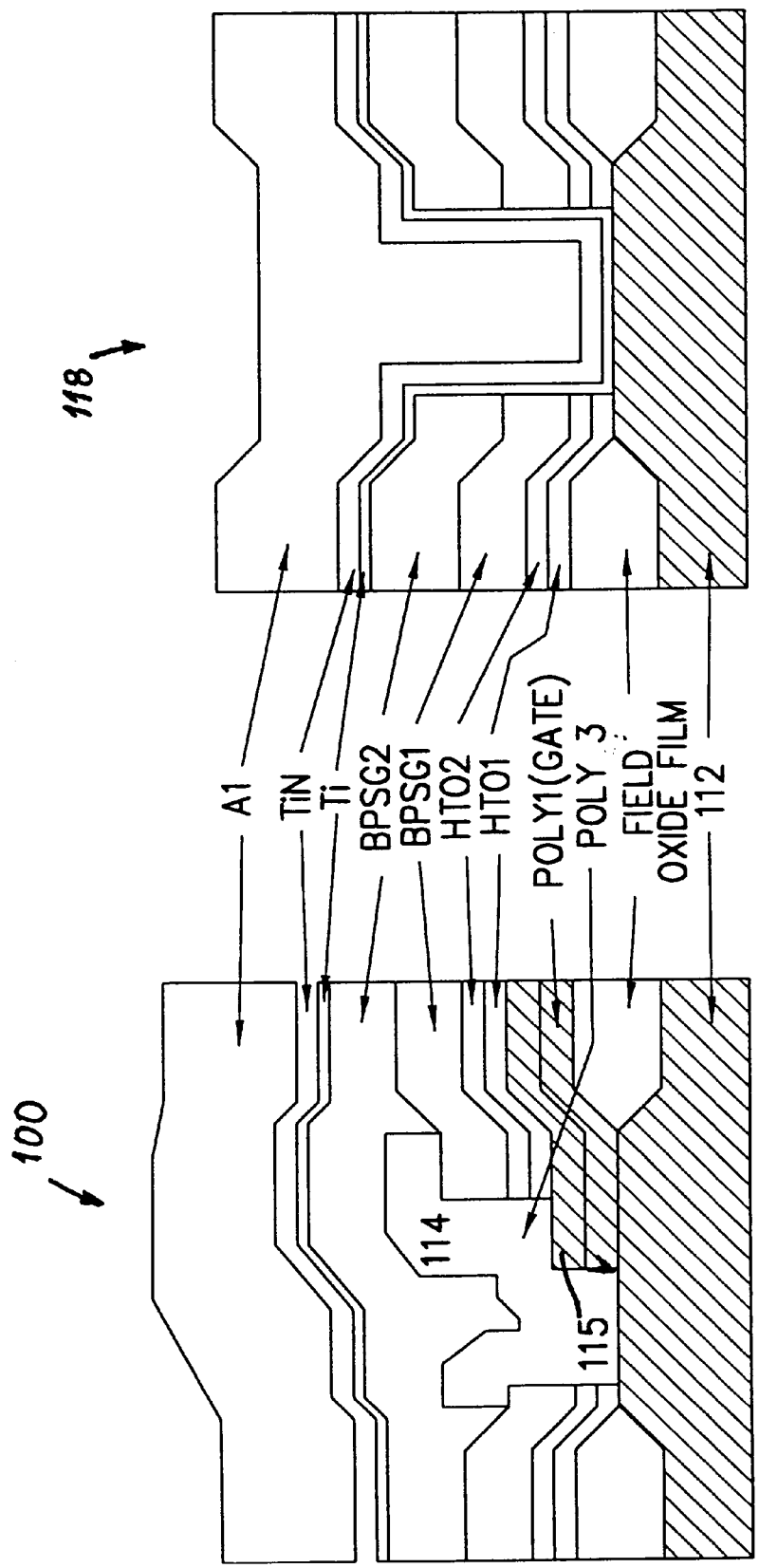
FIG. 3 is a detailed cross-sectional view of a word line reverse diode and a well bias tapping region according to the present invention.

FIG. 3 illustrates a detailed cross-sectional view of a word line reverse diode 100 (left side) and a well bias tapping region 118 (right side). As shown in FIG. 3, the word line reverse diode 100 includes an N+ cathode region 112 and a word line 115, labeled "POLY1 GATE" in FIG. 3. The POLY 3 contact 114 is used to connect the word line 115 to the cathode region 112. The layers labeled "HTO1" and "HTO2" are high temperature oxide insulating layers. The layers labeled "BPSG1" and "BPSG2" are borophosphosilicate glass insulating layers. The METAL 1 layer is shown as a combination of titanium (Ti), titanium nitride (TiN) and aluminum (Al) layers. The well bias tapping region 118 at the right side of FIG. 3 illustrates the METAL 1 layer comprising titanium, titanium nitride and aluminum, directly contacting the N+ region 112.

Accordingly, a word line arrangement of a memory cell array according to the present invention allows the ground voltage strapping line, the word line strapping line and the word line reverse diode to be located in the cell array without increasing the size of the chip. Therefore, the cost of the chip may be reduced, and the integration density may be increased.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A semiconductor memory device comprising:

first and second parallel word lines, each having a first end and a second end;

a first word line reverse diode connected to said first word line at said first end;

a second word line reverse diode connected to said second word line at said second end;

a first ground voltage strapping line, extending along the first ends of said first and second word lines;

a second ground voltage strapping line, extending along the second ends of said first and second word lines;

a first well bias tapping region in said second ground voltage strapping line, at the second end of said first word line; and a second well bias tapping region in said first ground voltage strapping line, at the first end of said second word line.

2. A semiconductor memory device according to claim 1 wherein said first word line reverse diode is in said first ground voltage strapping line and wherein said second word line reverse diode is in said second ground voltage strapping line.

3. A semiconductor memory device according to claim 1 wherein said first word line reverse diode and said second word line reverse diode electrically contact an N-type semiconductor region.

4. A semiconductor memory device according to claim 1 further comprising an array of memory cells connected to said first and second word lines.

5. A semiconductor memory device comprising:

a plurality of parallel word lines;

a plurality of word line reverse diodes located at alternating ends of said plurality of parallel word lines; and a plurality of well bias tapping regions located at alternating ends of said plurality of parallel word lines, but at opposite ends of said word lines from said plurality of reverse diodes.

6. A semiconductor memory device according to claim 5 further comprising first and second ground voltage strapping lines, a respective one of which extends along a respective end of said word lines, and wherein said plurality of word line reverse diodes and said plurality of well bias tapping regions are located in said first and second ground voltage strapping regions.

7. A semiconductor memory device according to claim 5 wherein said word line reverse diodes electrically contact an N-type semiconductor region.

8. A semiconductor memory device according to claim 5 further comprising an array of memory cells connected to said plurality of parallel word lines.

* * * * *